United States Patent
Heuermann

(10) Patent No.: US 8,508,241 B2
(45) Date of Patent: Aug. 13, 2013

(54) METHOD AND DEVICE FOR THE CALIBRATION OF NETWORK ANALYZERS USING A COMB GENERATOR

(75) Inventor: Holger Heuermann, Aachen (DE)

(73) Assignee: Rohde & Schwarz GmbH & Co. KG, Munich (DE)

(*) Notice: Subject to any disclaimer, the term of this patent is extended or adjusted under 35 U.S.C. 154(b) by 461 days.

(21) Appl. No.: 12/665,806

(22) PCT Filed: Apr. 11, 2008

(86) PCT No.: PCT/EP2008/002901
§ 371 (c)(1),
(2), (4) Date: Apr. 20, 2010

(87) PCT Pub. No.: WO2008/154976
PCT Pub. Date: Dec. 24, 2008

(65) Prior Publication Data
US 2010/0204943 A1    Aug. 12, 2010

(30) Foreign Application Priority Data
Jun. 21, 2007 (DE) .......................... 10 2007 028 725

(51) Int. Cl.
*G01R 27/04* (2006.01)
*G01R 27/32* (2006.01)
(52) U.S. Cl.
USPC ....................................................... 324/637
(58) Field of Classification Search
USPC ....................................................... 324/637
See application file for complete search history.

(56) References Cited

U.S. PATENT DOCUMENTS

| 6,529,844 | B1 | 3/2003 | Kapetanic et al. |
| 7,256,585 | B1* | 8/2007 | Shoulders ...................... 324/601 |
| 2004/0095145 | A1* | 5/2004 | Boudiaf et al. ............... 324/601 |
| 2004/0196051 | A1* | 10/2004 | Dunsmore et al. ............ 324/601 |
| 2004/0246004 | A1* | 12/2004 | Heuermann ................. 324/601 |
| 2005/0258815 | A1* | 11/2005 | Shoulders .................. 324/76.23 |

FOREIGN PATENT DOCUMENTS

| DE | 199 18 697 A1 | 11/1999 |
| DE | 199 18 960 A1 | 11/1999 |

OTHER PUBLICATIONS

Blockley P et al, "Mixer-based, vector-corrected, vector signal/network analyzer offering 300kHz-20 GHz bandwidth and traceable phase response", Microwave Symposium Digest, 2005 IEEE.

(Continued)

*Primary Examiner* — Jermele M Hollington
*Assistant Examiner* — Demetrius Pretlow
(74) *Attorney, Agent, or Firm* — Ditthavong Mori & Steiner, P.C.

(57) ABSTRACT

A vectorial network analyzer including n test ports. With the connection of several different calibration standards to the test ports, several calibration measurements are implemented. For the calibration, different measurements are implemented. Initially, in n calibration measurements, a comb-generator signal is supplied via a direct connection successively to all n test ports. Using a measuring point at the output of the comb generator and the measuring point associated with the respective test port, phase measurements are implemented at all of the frequencies forming the comb-generator signal. A frequency-dependent phase offset is determined from the phase measurements. Moreover, in at least one measurement, all n test ports are terminated successively in each case using known, input impedances, identical within one measurement, of arbitrary transmission properties, wherein successively, all n test ports are excited using a transmission oscillator successively with all frequencies of the comb-generator signal.

18 Claims, 4 Drawing Sheets

(56) References Cited

OTHER PUBLICATIONS

Blockley P et al, "Wide-bandwidth, vector-corrected measurement with high spurious-free dynamic range", ARFTG Conference Digest, Jun. 17, 2005, pp. 175-178.

Blockley P S et al, "The Random Component of Mixer-Based Nonlinear Vector Network Analyzer Measurement Uncertainty", IEEE Transactions on Microwave Theory and Techniques, vol. 55, No. 10, Oct. 1, 2007, pp. 2231-2239.

Denis Barataud et al, "Measurements of Time-Domain Voltage/Current Waveforms at RF and Microwave Frequencies Based on the Use of a Vector Network Analyzer for the Characterization . . . ", IEE Transactions on Instrumentation, vol. 47, No. 5, Oct. 1, 1998.

International Search Report, WO 2008/154976 A1, Aug. 27, 2008, pp. 1-8.

Jonathan Brereton Scott et al, "Enhanced On-Wafer Time-Domain Waveform Measurement Through Removal of Interconnect Dispersion and Measurement Instrument Jitter," IEEE Transactions on Microwave Theory and Techniques, vol. 50, No. 12, Dec. 1, 2002, pp. 3022-3028

Pailloncy et al, "Gaining advanced insight in the phase stability of comb generators using a Large-Signal Network Analyzer". . . .

Scott J B et al, "A new instrument architecture for millimetre-wave time-domain signal analysis", ARFTG 63rd Conference, Spring 2004, Fort Worth, TX, Jun. 11, 2004, pp. 47-52.

Van Den Broeck T et al, "Calibrated vectorial nonlinear-network analyzers", Microwave Symposium Digest, 1994, May 23, 1994, pp. 1069-1072.

Wendy Van Moer et al, "A large-signal network analyzer: Why is it needed?" IEEE Microwave Magazine vol. 7, No. 6, Jan. 1, 2006, pp. 46-62.

International Preliminary Report on Patentability, PCT/EP2008/002901, Feb. 11, 2010, pp. 1-16.

* cited by examiner

METHOD AND DEVICE FOR THE CALIBRATION OF NETWORK ANALYZERS USING A COMB GENERATOR

CROSS-REFERENCE TO RELATED APPLICATION

The present application is a national phase application of PCT Application No. PCT/EP2008/002901, filed on Apr. 11, 2008, and claims priority to German Application No. 10 2007 028 725.0, filed on Jun. 21, 2007, the entire contents of which are herein incorporated by reference.

BACKGROUND OF THE INVENTION

1. Field of the Invention

The invention relates to a method and a device for calibrating vectorial network analyzers for the measurement of linear and non-linear electrical parameters, preferably without through connections.

2. Discussion of the Background

In precision electronics, at low frequencies down towards microwave technology in the GHz range, vectorial network analyzers (VNA) are used for the accurate measurement of electronic parts and components of active and passive circuits and component groups.

A VNA registers the so-called scattering parameters of n-port devices (n=1, 2, ... ), which are optionally converted into 2n-pole parameters (for example, Z-parameters or Y-parameters). However, with medium to high frequencies (fast circuits), these recorded data provide very large measurement errors. A so-called system-error correction of the VNA ensures that accurate measurements of fast electronic components are at all realisable. The measurement accuracy of VNAs depends primarily upon the availability of a method for system-error correction.

In the case of system-error correction, within the so-called calibration process, devices under test, which are known in part or in their entirety, are measured with regard to reflection and/or transmission behavior. This is known, for example, from DE 198 18 877 A1 and from DE 199 18 960 A1. Correction data (so-called error-values or coefficients) are obtained from these measured values, via special computational methods. With these correction data and a corresponding correction calculation, measured values, which have been freed from system errors of the VNA and supply lines (error couplings=crosstalk, error matching=reflections) are obtained for every required device under test.

The conventional form of description for the electrical behavior of components and circuits in high-frequency technology is provided via the scattering parameters (also referred to as S-parameters). The scattering parameters link together not currents and voltages, but wave sizes. This presentation is particularly well adapted to the physical circumstances of high-frequency technology. If required, these scattering parameters can be converted into other electrical network parameters, which link currents and voltages.

FIG. 1 shows a two-port device, which can be characterized by its scattering matrix [S]. Let the waves $a_1$ and $a_2$ be the waves flowing towards the two-port device, $b_1$ and $b_2$ corresponding to the waves propagated in the reverse direction. The following relationship applies:

$$\begin{pmatrix} b_1 \\ b_2 \end{pmatrix} = \begin{pmatrix} S_{11} & S_{12} \\ S_{21} & S_{22} \end{pmatrix} \begin{pmatrix} a_1 \\ a_2 \end{pmatrix}$$

A linear component is adequately described by these S-parameters, which are indicated via the frequency. In the case of a component, which provides non-linear effects, with a supply of a signal with the frequency $f_0$ at one port to the other ports, signals are generated with this fundamental frequency ($f_0$) and other frequencies. These can be, for example, harmonics with the frequencies $m^*f_0$ (m=2, 3, 4, ... ) or, in the case of a substitution of several transmission generators, inter-modulation products or mixing products. If one of the transmission generators is modulated, the number of frequencies is correspondingly large. The scattering parameters described above can also be advantageously used to describe the transmission behavior for these non-linear components. However, it must now be taken into consideration, that not only the ports, but also the frequencies are indicated.

Accordingly, the vectorial scattering parameters $S_{21}{}^{10}$ can be introduced as transmission parameters with the input port 1 in the case of the fundamental wave of frequency $f_0$ and with the output port 2 in the case of the harmonic wave with the frequency $f_1=2^*f_0$.

However, in many applications, these non-linear transmission properties of parts and components are not measured with a vectorial measuring device, because cost-favourable devices are not available. However, the vectorial values are extremely important for the modelling of parts such as transistors.

Purely scalar structures are the prior art for these measurements. Modern vectorial network analyzers provide software options, which permit the measurements of harmonics, inter-modulations, mixing products and similar in organizational terms. However, these are implemented in a purely scalar manner and accordingly without system-error correction.

Calibration methods, which require a large number of through connections are used for the measurement of linear multi-port devices. One frequently used method for the implementation of multi-port measurements is based upon the 10-term method according to DE 198 18 878 A1 and DE 199 18 697 A1. These require the connection of all test ports. That is to say, that even with an 8-port device, 28 through connections are required (calculated as follows: $n/2^*(n-1)$).

8-port network analyzers are already conventional. The manufacturers often provides automatic calibration units for these devices. However, the internal cost for these applications is very high.

The user of modern measurement technology would like vectorial scattering parameters not only at the fundamental frequency but also with frequency translation at a reasonable cost. This cost should be disposed only slightly above the cost for current scattering-parameter measurements.

SUMMARY OF THE INVENTION

The invention is advantageously provides a method and a device for calibrating vectorial network analyzers, which can also be automated for large numbers of test ports at low cost and which is/are suitable for calibrating for the measurement of linear and also non-linear parameters. In this context, a capability for the measurement of frequency-translating parts is desirable.

For the calibration of the vectorial network analyzers, which provide n test ports, several calibration measurements are implemented. In this context, several different calibration standards are connected to the test ports. A series of measurements is implemented for the calibration:

Initially, in n calibration measurements, a comb-generator signal is supplied via a direct connection successively to all n test ports. By means of a measuring point at the output of the comb generator and the measuring point associated with the respective test port, phase measurements are implemented at all of the frequencies forming the comb-generator signal. A frequency-dependent phase offset is determined from the phase measurements. Furthermore, with at least one, but preferably three measurements, all n test ports are terminated successively by means of respectively known input impedances, identical within one measurement, of arbitrary transmission properties, wherein all n test ports are excited by means of a transmission oscillator successively with all frequencies of the comb-generator signal. The input impedances of the different measurements differ significantly in this context. With the test procedure described, the network analyzer can be calibrated without the need for through connections. Moreover, a phase-synchronous, frequency-translating measurement is possible after this calibration.

An advantageous, known and long-term-stable frequency-response characteristic of the power of the comb generator allows an unambiguous characterization of the error networks without further measurements.

In n further calibration measurements, all n test ports are advantageously connected successively to a power meter. With an unknown and/or a non-long-term-stable frequency-response characteristic of the power of the comb generator, a complete calibration is possible through these additional measurements.

During the measurements, the reflection parameters and transmission parameters are advantageously measured at all connections of the vectorial network analyzer connected to the test ports. Error networks, which are used for the correction calculation of raw test values, are advantageously calculated from the parameters measured in this manner and the phase offset. Accordingly, all of the parameters required for the correction calculation are available.

The powers of the waves flowing from the test ports are advantageously taken into consideration in the calculation of the error networks. In the case of an unknown frequency-response characteristic of the power of the comb-generator signal or inadequate long-term stability, a complete characterization of the error networks can be achieved in this manner.

The at least one transmission oscillator is advantageously connected to a reference quartz oscillator. The comb generator is advantageously also connected to the reference quartz oscillator. Through the connection of the comb generator and the transmission oscillator to the same reference quartz oscillator, a phase-synchronous measurement is possible.

The calibration standards and/or the comb generator and/or the power meter are advantageously connected in an electronically-controlled manner with the use of an auto-calibration unit and changeover switch. Accordingly, a rapid calibration is possible without personnel costs and with large numbers of test ports.

With the additional use of only one comb generator and one power meter, the invention allows the manufacture of the non-linear VNA from a VNA. Accordingly, it is possible, without much additional cost by comparison with the prior art for the measurement of linear components, to provide a VNA for the measurement of non-linear VNA.

Automatic calibration units for the associated calibration method consists of only three single-port standards and a power meter, which the manufacturers of VNAs have at their disposal. Accordingly, the calibration unit is simplified by comparison with the known multi-port VNA by several orders of magnitude. Even applications with 15 and more ports can be calibrated in a simple manner.

The invention is described by way of example with reference to the drawings, in which an advantageous exemplary embodiment of the invention is presented. The drawings are as follows:

DETAILED DESCRIPTION OF EXEMPLARY EMBODIMENTS OF THE INVENTION

The structure and the configuration according to the invention of the network analyzer to be calibrated is initially explained with reference to FIGS. 1-2. The calibration method according to the invention is shown in the sequence of test arrangements with reference to FIGS. 3-7. In some cases, the presentation and description of identical elements in similar drawings have not been repeated.

Figure 1:
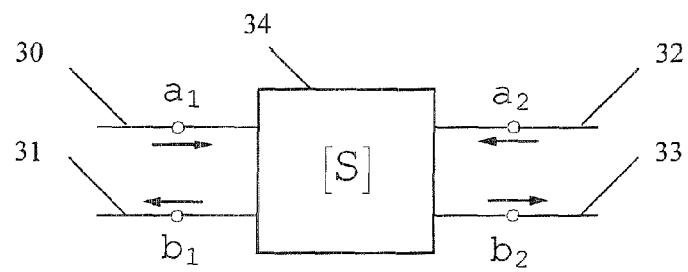
FIG. 1 shows an exemplary circuit diagram of a two-port device with four connections.

FIG. 1 shows a two-port device, which is characterized by a scattering matrix [S]. Let the waves $a_1$ and $a_2$ be the waves flowing towards the two-port device, $b_1$ and $b_2$ corresponding to the waves propagated in the reverse direction. The following relationship applies:

$$\begin{pmatrix} b_1 \\ b_2 \end{pmatrix} = \begin{pmatrix} S_{11} & S_{12} \\ S_{21} & S_{22} \end{pmatrix} \begin{pmatrix} a_1 \\ a_2 \end{pmatrix}$$

Figure 2:
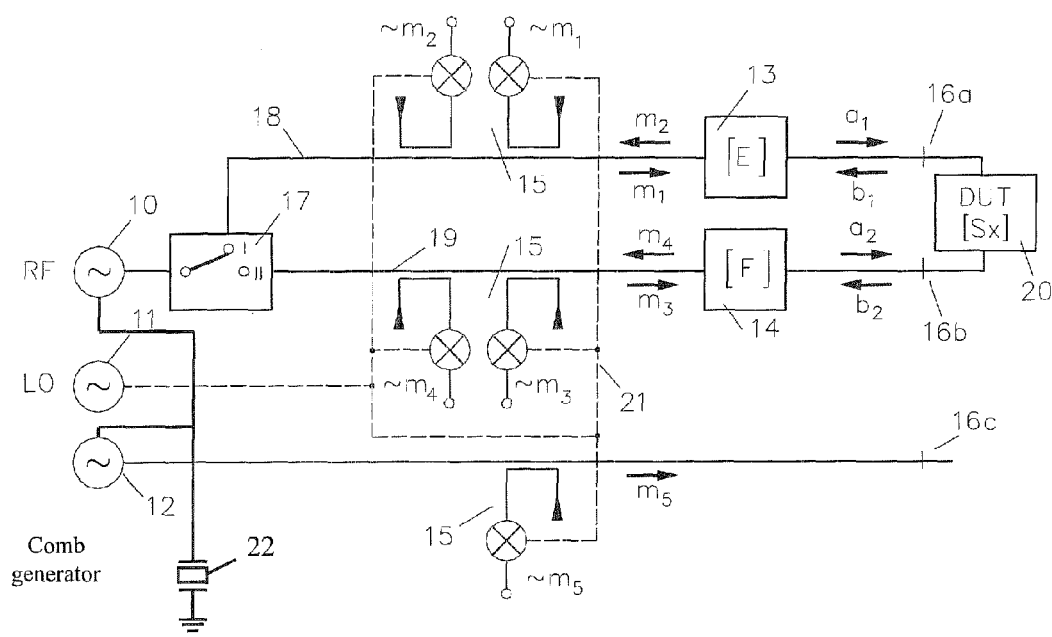
FIG. 2 shows a circuit diagram of an exemplary embodiment of the calibration device according to the invention.

FIG. 2 illustrates the case, which is relevant in practice, of a 2-port network analyzer system according to the so-called reflectometer concept as a block circuit diagram. It is evident that 2n+1 measuring points 15 are necessary for the measurement of an n-port device. FIG. 2 indicates how a structure of this kind can be realized and serves as a basis for the description of the calibration method.

The network analyzer could also be structured according to the so-called GSOLT concept and would then require only n+2 measuring points for the measurement of an n-port device. In this case, one measuring point is disposed directly behind the RF oscillator 10 and the measuring points ~$m_2$ and ~$m_4$ are dispensed with. With this architecture, the switch is now part of the error networks and must provide long-term stability. With the concept according to FIG. 2, the switch 17 can be replaced by using, and activating if required, two (or in the case of a multi-port n) RF sources. A multi-port arrangement is obtained by adding further outputs to the switch 17 and supplementing the test channels with the measuring points 15. In the following section, only a two-port VNA will be considered with reference to FIG. 2. However, these considerations can readily be expanded with regard to a multi-port device.

FIG. 2 shows how the high-frequency signal of the RF source 10 is guided to the two branches 18 or 19 via a changeover switch 17, whose properties of reproducibility, reflection, long-term stability are not included in the measurement accuracy but in a possible displacement of the operating point. In each case, the linear-translating measuring points 15 register a measure for the outgoing, reflected or transmitted wave. The signals of the measuring points are preferably called up in parallel, but can also be called up in a serial manner, because this measurement system including the switches and oscillators is short term stable. The measuring points are illustrated by a coupler and a mixer. For the frequency translation of the RF signal into a low-frequency intermediate frequency range (IF-signal), a second generator is required. This is the LO-generator 11, which feeds the mixers via signal dividers not shown in FIG. 2 and the lines 21. Several LO oscillators can also be used to implement frequency-translating measurements identical in time. All of the deterministic non-idealities and inadequacies of the VNAs between changeover switches and test port levels in the form of error-matchings and crosstalk are combined and taken into consideration in the error matrices 13 and 14. At the test ports 16a and 16b, the device under test 20 (DUT: device under test) is connected to the two-port vectorial network analyzer. By contrast with a VNA for linear measurements, a comb generator 12 is now required. Its output signal is detected, on one hand, from the measuring point ~$m_S$ and is available, on the other hand, as a calibration signal at the test port output 16c. All three generators 10, 11 and 12 are preferably connected to a reference quartz oscillator 22. Accordingly, the harmonics of the comb generator are disposed in a fixed phase ratio relative to the fundamental oscillation of the reference quartz oscillator 22.

The calibration method of this invention will be referred to below as the WT method (WT: Without Thru). From the mathematical perspective, this method can be divided into two steps:
1. direct calibration and
2. system-error correction.

In the first step "direct calibration", the calibration standards are initially measured; the powers at the test ports are then determined by means of a power meter; following this, the phase of the comb-generator signal is measured; and finally, the error coefficients are calculated. For this purpose, all electrical properties of the calibration standards must be known (for example, in the form of scattering parameters). With this calibration method, only so-called absolute standards are used. Absolute standards are physical parts, whose electrical behavior is known from precision manufacture and calculation. For the WT method, the following three absolute standards are generally used:
1. The impedance standard Match (match; M) must be known in its entirety, but, in the WT method can be different from the reference impedance (generally 50Ω). Standards of this kind are often also referred to as Transfer-Match.
2., 3. The reflection standards Short (Short; S) and Open (Open; O) must be known in their entirety, but in the WT method, need not observe the ideal values of a short-circuit or an open circuit. Standards of this kind are often also referred to as Transfer-Reflect. The absolute standards S and O are described precisely by the manufacturers, and these values are used directly.

The standards M, S and O can also be replaced by three other, known reflection standards such as three Offset-Shorts.

As specified in the claims, in the WT method, the three single-port standards M, S and O are contacted and measured for the calibration at every test port (here 16a and 16b). After this, the power of the outgoing wave is detected at every test port (here 16a and 16b) by means of a power meter. Finally, the comb-generator signal of the output 16c is connected to every test port (here 16a and 16b), and the associated transmission phase is detected.

From these data, the four absolute error coefficients are calculated for every reflectometer (here 13 and 14). That is to say, an n-fold single-port calibration takes place. Since the error networks are absolutely known, no further through connection or other transmission information is required. Accordingly, 8 error terms are determined for the VNA according to FIG. 2. The associated mathematics for a single-port calibration is based upon the mathematical results in P.

Blockley, D. Gunyan, and J. B. Scott, "Mixer-based, vector-corrected, vector signal/network analyzer offering 300 kHz-20 GHz," IEEE MTT-S, June 2005 or the documents cited therein. The calculation of the error coefficients $E_D$, $E_S$ and $E_{FR}$ of the 3-term method is adequately known from the literature. $E_R$ can now be calculated by means of the comb-generator measurement and the power measurement.

The formulae for calculating the modulus and the phase of the error coefficients $E_R$ are as follows:

$$|E_R|^2 = \frac{|E_S \cdot b_{1m} - a_{1m} \cdot \Delta X|^2 \cdot (1 - |\Gamma_C|^2)}{P_{meter1}}$$

$$\angle(E_R) = \angle\left(\frac{b_{1m} - b_{1m} \cdot E_S \cdot \Gamma_R - E_D \cdot a_{1m} + \Delta X \cdot a_{1m} \cdot \Gamma_R}{a_R}\right)$$

$\Gamma_C$: Reflection factor of the power meter
$\Gamma_R$: Reflection factor of the phase reference
$a_R$: Wave falling into the phase reference
with $$\Delta X = E_D \cdot E_S - E_{FR}$$

In the case of the wave parameters $a_{1m}$ and $b_{1m}$, the wave parameters for port 1 are $m_1$ and $m_2$. Now, since $E_R$ and $E_{FR}$ are known, $E_F$ can be calculated: $E_F = E_{FR}/E_R$.

In the second step "system-error correction", the measured data of an unknown device under test are corrected from the errors of the VNAs and the supply lines. At present, there are many interesting approaches to the derivation of a mathematical solution for this problem. The inventor has prepared and published a broad spectrum of mathematical solutions for two-port arrangements and also readily-programmable alternatives to the known solutions for multi-port solutions. All of the solutions can be adapted from the theory of linear VNA measurements.

For example, the error coefficients of the matrices [E] and [F] defined as S parameters can be converted into the error matrices [A] and [$B_1$], which are based on transmission coefficients. This approach can also be expanded directly into the multi-port problem with the error matrices [A] and [$B_i$] where i=1, 2, . . . , n−1. The error model in FIG. 2 forms the starting point for the mathematical description. Moreover, it is advantageous to start the mathematical formulation of the error 2-port devices in the inverse form of the transmission parameters indicated:

$$[G]=[A]^{-1}, [H_i]=B_i^{-1}, i=1, 2, \ldots, n-1 \quad (2)$$

wherein the following applies for the inputs and outputs to the error networks:

$$\begin{pmatrix} b_1 \\ a_1 \end{pmatrix} = [G] * \begin{pmatrix} m_1 \\ m_2 \end{pmatrix}, \begin{pmatrix} a_i \\ b_i \end{pmatrix} = [H_i] * \begin{pmatrix} m_{2i-1} \\ m_{2i} \end{pmatrix} \quad (3)$$

These equations can be resolved according to the wave parameters $a_i$ and $b_i$ and used for a four-port device in the equation:

$$\begin{pmatrix} b_1 \\ b_2 \\ b_3 \\ b_4 \end{pmatrix} = [Sx] \begin{pmatrix} a_1 \\ a_2 \\ a_3 \\ a_4 \end{pmatrix} \quad (4)$$

In this context, the values of a matrix column, which ultimately leads to a linear equation system consisting of two n*n measured-value matrices and the n*n scattering matrix, are obtained for every switch position. If this equation system is resolved according to the [Sx] matrix, the error-corrected scattering parameters of an n-port device are available.

Two or more test ports, which are allocated to a VNA, need not be disposed in immediate spatial proximity, since, for the first time, a through connection is no longer necessary with this calibration method.

Consequently, it is possible to measure accurately transmission paths, which are disposed at a great distance. Accordingly, analyses of air and atmosphere can be implemented. An entirely new measurement resource is provided for microwave analysis. Antennae can also be advantageously measured over great distances and therefore under remote-field conditions. A plurality of environmental influences can therefore be analyzed via accurate phase measurements of free-space transmission paths.

Figure 3:
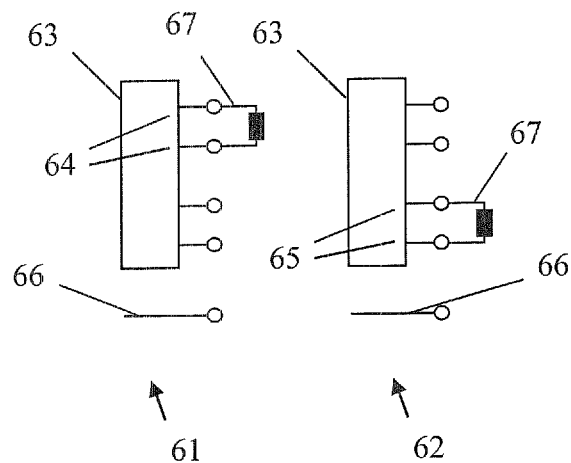
FIG. 3 shows a first exemplary sequence of calibration measurements with a wave termination as calibration standard at the test ports of a vectorial analyzer.

FIG. 3 shows a first exemplary sequence of calibration measurements with a wave termination as calibration standard at the test ports of a vectorial network analyzer. The various presentations of the network analyzer 61-62 show successive steps of the calibration measurement. The first step 61 of calibration measurement on the network analyzer 63 is explained here. At the first port 64 of the network analyzer 63, an impedance 67 is connected as the termination. The comb generator 66 is not connected. The second step 62 of a calibration measurement is further explained. At the second port 65 of the network analyzer 63, an impedance 67 is connected as the termination. The comb generator 66 is not connected.

Figure 4:
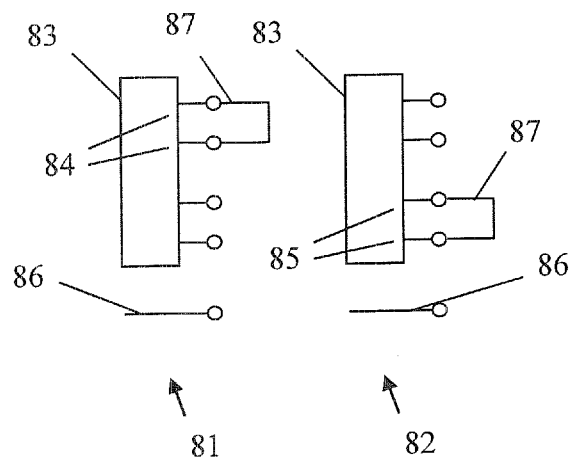
FIG. 4 shows a second exemplary sequence of calibration measurements with a short-circuit as calibration standard at the test ports of a vectorial network analyzer.

In FIG. 4, a second exemplary sequence of calibration measurements with a short-circuit as calibration standard at the test ports of a vectorial network analyzer is shown. The various presentations of the network analyzer 81-82 show successive steps of the calibration measurement. The first step 81 of a calibration measurement on the network analyzer 83 is explained here. At the first port 84 of the network analyzer 83, a short-circuit 87 is connected as the termination. The comb generator 86 is not connected. The second step 82 of a calibration measurement is further explained. At the second port 85 of the network analyzer 83, a short-circuit 87 is connected as the termination. The comb generator 86 is not connected.

Figure 5:
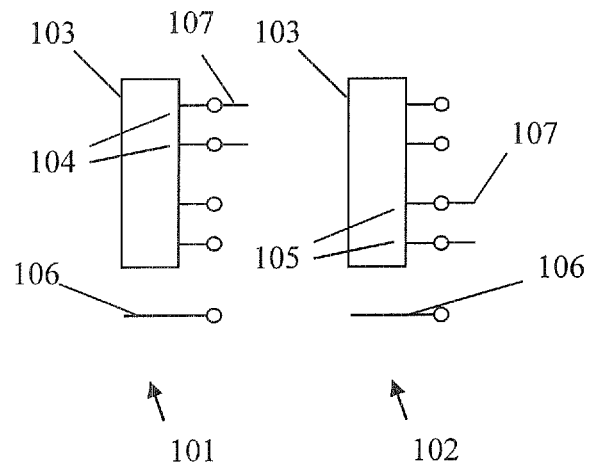
FIG. 5 shows a third exemplary sequence of calibration measurements with an open circuit as calibration standard at the test ports of a vectorial network analyzer.

FIG. 5 shows a third exemplary sequence of calibration measurements with an open circuit as calibration standard at the test ports of a vectorial network analyzer. The various presentations of the network analyzer 101-102 show successive steps of the calibration measurement. The first step 101 of a calibration measurement on the network analyzer 103 is explained here. At the first port 104 of the network analyzer 103, an open circuit 107 is connected as the termination. The comb generator 106 is not connected. The second step 102 of a calibration measurement is further explained. At the second port 105 of the network analyzer 103, an open circuit 107 is connected as the termination. The comb generator 106 is not connected.

Figure 6:
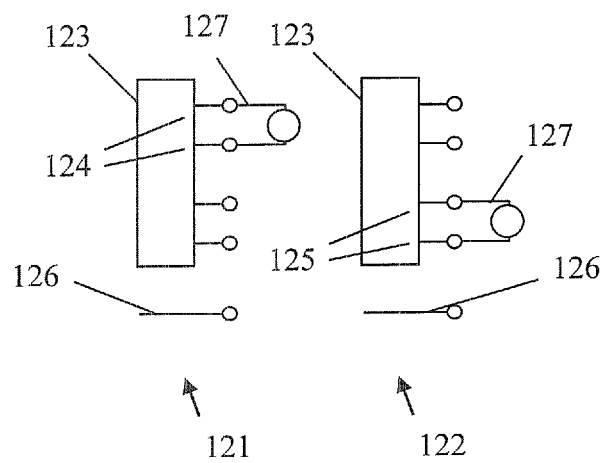
FIG. 6 shows a fourth exemplary sequence of calibration measurements for measuring the power at the test ports of a vectorial network analyzer.

In FIG. 6, a fourth exemplary sequence of calibration measurements for the measurement of the power at the test ports of a vectorial network analyzer is shown. The various presentations of the network analyzer 121-122 show successive steps of the calibration measurement. The first step 121 of the calibration measurement on the network analyzer 123 is explained here. At the first port 124 of the network analyzer 123, a power meter 127 is connected. The comb generator 126 is not connected. The second step 122 of a calibration measurement is further explained. At the second port 125 of the network analyzer 123, a power meter 127 is connected. The comb generator is not connected. The power meter 127 measures the power flowing from the respective test port 124, 125.

Figure 7:
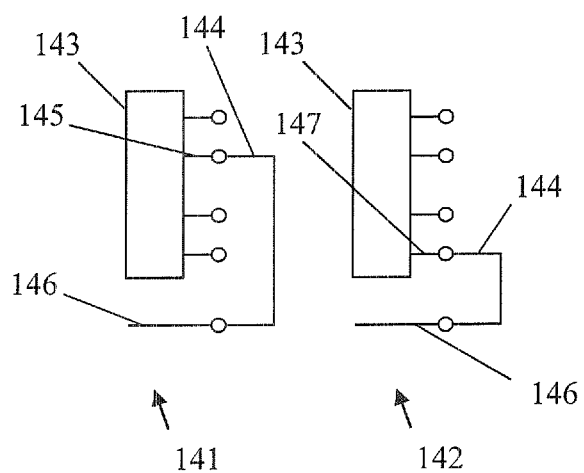
FIG. 7 shows a fifth exemplary sequence of calibration measurements at the test ports of a vectorial network analyzer for measuring the transmission by means of a comb generator.

FIG. 7 shows a fifth exemplary sequence of calibration measurements at the test ports of a vectorial network analyzer for measuring the transmission by means of a comb generator. The various presentations of the network analyzer 141-142 show successive steps of the calibration measurement. The first step 141 of the calibration measurement on the network analyzer 143 is explained here. A first connection 145 of a first test port of the network analyzer 143 is connected by means of a connecting line 144 to the comb generator 141. The second step 142 of a calibration measurement is further explained. A second connection 147 of a first test port of the network analyzer 143 is connected to the comb generator 141 by means of a connecting line 144. During this measurement, the transmission oscillator 10 is switched off. The comb-generator signal is fed in at the respective connection 145, 147 and measured at the measuring point associated with the respective connection. In this context, the phase of the signal is determined.

The invention is not restricted to the exemplary embodiment presented. As already mentioned, different calibration standards can be used. The use of an arbitrary number of test ports is also possible. All of the features described above or illustrated in the drawings can be combined with one another as required within the framework of the invention.

The invention claimed is:

1. A method for the calibration of vectorial network analyzers, which comprise n test ports, wherein several different calibration standards are connected to the test ports, and wherein n is an arbitrary number greater than 1, the method comprising:
performing n calibration measurements by:
connecting a comb-generator for providing a comb-generator signal, using a connecting line, successively to all n test ports,
the comb-generator signal comprising a sum of several sinusoidal signals of equidistant frequency interval,
successively measuring the phase of the individual signals of the comb-generator signal at the same time at a measuring point on the comb generator and at a measuring point of the respective test port, and determining a frequency-dependent phase offset of the individual signals from the measured phase values, and performing another calibration measurement by:

terminating all n test ports in each case using known, identical, first input impedances of arbitrary transmission properties, and successively exciting all n test ports using a transmission oscillator successively with all frequencies of the comb-generator signal.

2. The method according to claim 1, further comprising:

conducting a further calibration measurement by:

terminating all n test ports in each case using known, identical, second input impedances of arbitrary transmission properties, which differ from the first input impedances, exciting, successively, all n test ports using a transmission oscillator successively with all frequencies of the comb-generator signal, and conducting still further calibration measurement by:

terminating all n test ports in each case using known, identical, third input impedances of arbitrary transmission properties, which differ from the first and second input impedances, and exciting, successively, all n test ports using a transmission oscillator successively with all frequencies of the comb-generator signal.

3. The method according to claim 1, wherein the frequency-response characteristic of the power of the comb-generator signal is known and long-term stable.

4. The method according to claim 1, wherein the frequency-response characteristic of the power of the comb-generator signal is not known and/or not long-term stable, and performing further n calibration measurements by:

successively connecting all n test ports to a power meter, measuring the power of the wave flowing from the test port, and exciting, successively, all n test ports using a transmission oscillator successively with all frequencies of the comb-generator signal.

5. The method according to claim 1, further comprising:

measuring reflection parameters and transmission parameters at all connections of the vectorial network analyzer connected to the test ports, calculating error networks from the measured reflection parameters, transmission parameters and the phase offset, and presenting the error networks through matrices, which contain the data necessary for a correction calculation of raw measured values.

6. The method according to claim 1, further comprising:

measuring reflection parameters and transmission parameters at all connections of the vectorial network analyzer connected to the test ports, calculating error networks from the measured reflection parameters, transmission parameters, the phase offset and the power of the waves flowing from the test ports, and presenting the error networks through matrices, which contain the data necessary for a correction calculation of raw measured values.

7. The method according to claim 1, wherein the transmission oscillator is coupled to a reference oscillator, and wherein the comb generator is coupled to the same reference oscillator.

8. The method according to claim 1, further comprising:

connecting the calibration standards and/or the comb generator in an electronically-controlled manner through an auto-calibration unit with the use of a changeover switch.

9. The method according to claim 4, further comprising:

connecting a power meter in an electronically-controlled manner through an auto-calibration unit with the use of a changeover switch.

10. A device for the calibration of vectorial network analyzers, comprising:

n test ports having different calibration standards, wherein n is an arbitrary number greater than 1, and the device implements a plurality of measurements for the calibration:

a comb-generator for supplying a comb-generator signal using a connecting line successively to all n test ports, the comb-generator signal being a sum of several sinusoidal signals of equidistant frequency interval, means for measuring, successively, the phase of the individual signals of the comb-generator signal at the same time at a measuring point on the comb generator and at a measuring point of the respective test port, and means for determining a frequency-dependent phase offset from the measured phases, wherein the comb-generator, the means for measuring, and the means for determining conduct first n calibration measurements;

a terminating means for terminating all n test ports in each case using known, identical, first input impedances of arbitrary transmission properties, and an exciting means for exciting, successively, all n test ports using a transmission oscillator successively with all frequencies of the comb-generator signal, wherein the terminating means and the exciting means conduct second n calibration measurements.

11. The device according to claim 10, wherein the terminating means terminates all n test ports in each case using known, identical, second input impedances of arbitrary transmission properties, which differ from the first input impedances, and the exciting means, successively, excites all n test ports using a transmission oscillator successively with all frequencies of the comb-generator signal, wherein the terminating means and the exciting means conduct third n calibration measurements; and wherein the termination means terminates all n test ports in each case using known, identical, third input impedances of arbitrary transmission properties, which differ from the first and second input impedances, and the exciting means excites, successively, all n test ports using a transmission oscillator successively with all frequencies of the comb-generator signal;

wherein the terminating means and the exciting means conduct fourth n calibration measurements.

12. The device according to claim 10, wherein the frequency-response characteristic of the power of the comb-generator signal is known and long-term stable.

13. The device according to claim 10, wherein the frequency-response characteristic of the power of the comb-generator signal is not known and/or not long-term stable, and further comprising:

a power meter to which the device connects all n test ports successively, and means for measuring the power of the wave flowing from the test port, wherein the exciting means excites, successively, all n test ports using a transmission oscillator successively with all frequencies of the comb-generator signal, and the power meter, means for measuring the power of the wave flowing from the test port, and the exciting means conduct third n calibration measurements.

14. The device according to claim 10, further comprising:

means for measuring reflection parameters and transmission parameters at all connections of the vectorial network analyzer connected to the test ports, and a computational device for calculating error networks from the measured reflection parameters, transmission parameters and the phase offset, wherein the error networks are presented through matrices, which contain the data necessary for a correction calculation of raw measured values.

15. The device according to claim 10, further comprising:

means for measuring reflection parameters and transmission parameters at all connections of the vectorial network analyzer connected to the test ports, a computational device for calculating error networks from the measured reflection parameters, transmission parameters, the phase offset and the power of the waves flowing from the test ports, wherein the error networks are presented through matrices, which contain the data necessary for a correction calculation of raw measured values.

16. The device according to claim 10, wherein the transmission oscillator is coupled to a reference oscillator, and wherein the comb generator is coupled to the same reference oscillator.

17. The device according to claim 10, wherein the device connects the calibration standards and/or the comb generator in an electronically-controlled manner through an auto-calibration unit with the use of a changeover switch.

18. The device according to claim 10, further comprising:

a power meter connected to the device in an electronically-controlled manner through an auto-calibration unit with the use of a changeover switch.

* * * * *